(12) United States Patent
Farooq et al.

(10) Patent No.: US 6,255,827 B1
(45) Date of Patent: Jul. 3, 2001

(54) SEARCH ROUTINE FOR 2-POINT ELECTRICAL TESTER

(75) Inventors: Mukta S. Farooq, Hopewell Junction; Vincent P. Peterson, Poughkeepsie; Kathleen M. Wiley, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/302,944

(22) Filed: Apr. 30, 1999

(51) Int. Cl.[7] .......................... H01H 31/02; G01R 31/02
(52) U.S. Cl. ............................. 324/537; 324/758
(58) Field of Search .......................... 324/537, 519, 324/758, 538, 158.1, 756

(56) References Cited

U.S. PATENT DOCUMENTS

| | | |
|---|---|---|
| 3,806,800 | 4/1974 | Bove et al. . |
| 3,806,801 | 4/1974 | Bove et al. . |
| 3,963,985 | 6/1976 | Geldermans . |
| 3,963,986 | 6/1976 | Morton et al. . |
| 4,816,754 | 3/1989 | Buechele et al. . |
| 5,373,231 | 12/1994 | Boll et al. . |
| 5,491,427 | 2/1996 | Ueno et al. . |
| 5,786,697 | * 7/1998 | Khazam et al. ..................... 324/537 |

* cited by examiner

Primary Examiner—Safet Metjahic
Assistant Examiner—J. Kerveros
(74) Attorney, Agent, or Firm—DeLio & Peterson, LLC; Kelly Reynolds; Margaret A. Pepper

(57) ABSTRACT

A system for locating electrically conductive contact points on an integrated circuit semiconductor substrate utilizes capacitance and line continuity measurements to control and direct the movement of a two-point probe tester in order to locate and precisely align each test probe with designated contact points. The system is capable of testing for continuity conditions or defects and perform other related electrical measurements.

30 Claims, 4 Drawing Sheets

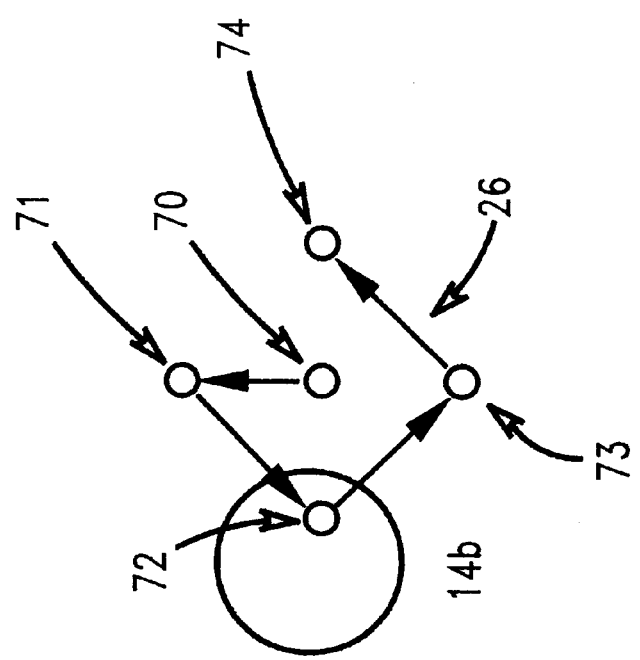
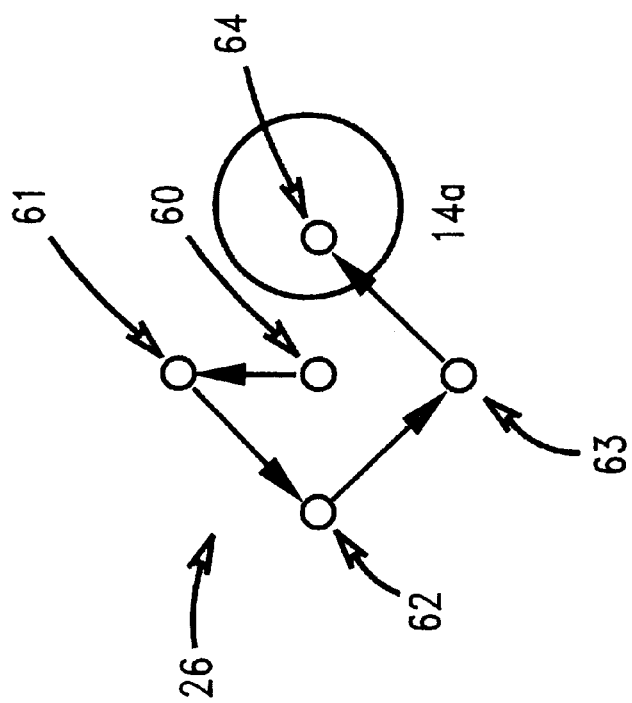
FIG. 5

SEARCH ROUTINE FOR 2-POINT ELECTRICAL TESTER

BACKGROUND OF THE INVENTION

1. Field of the Invention

This invention relates to a process and apparatus for locating electrically conductive terminal pads or contact points on a substrate and more particularly to a process and apparatus for using two probes to test line continuity, capacitance and related electrical measurements on a distorted or non-uniform ceramic substrate.

2. Description of Related Art

Electrical testers are used in the electronics packaging industry to detect the presence of defects which affect the electrical performance of the semiconductor package. The defects tested for can include circuit line opens and shorts, near opens and near shorts.

In testing the functionality of an integrated circuit in a semiconductor or other substrate, probes are used to engage electrically conductive terminal pads or contact points. Precise alignment of a probe relative to a terminal pad or contact point is required in order to ensure electrical contact between the probe and the contact point. In many cases, after processing and heat treatment, the contact points on a substrate are not located at the precise coordinate specified in the design, but have shifted to a new location due to design factors or processing conditions. This phenomenon is very common in ceramic packaging. If the positional error is large enough, the probe will not make electrical contact with a designated contact point and the tester will report an open in the network under test. Since invalid opens can be a common occurrence, it is assumed that the initial open is due to a probe not making contact with the contact point and a probe adjustment-retest loop is initiated. The probe adjustment-retest loop is either a manual repositioning of the probe or software controlled search routine. A manual search relies upon intervention from the test operator to reposition the probes in the direction of the contact point, while a software controlled routine automatically steps the probes a preset distance and direction in an attempt to locate the contact point. The probe adjustment-retest loop continues until either the operator is convinced that the probes are contacting the contact points and the open fault indication is valid, or the search routine is completed.

The manual process for locating contact points is inefficient because it relies upon intervention from the operator to determine the actual contact point location and manually reposition the probes. This can be time consuming, labor intensive and prone to human error. The software controlled routine, while effective in performing a single point capacitance test, is less effective when attempting to perform a two point resistance measurement because the software controlled routine shifts each probe by a preset distance in the same direction. Thus, if one probe is in contact with its respective contact point and the other probe is not contacting the designated contact point, the probe making contact may be moved off it's contact point during the retest. If both probes are constrained to move the same direction and distance, they may never contact their respective contact points simultaneously and a good part may be discarded because of an invalid fault indication.

A further problem frequently encountered in substrate electrical testing is how to efficiently test products which have terminal pad sizes of less than 100 um. As the size and pitch of semiconductor input-outputs continue to shrink with the implementation of advanced ground rule designs, the task of electrically probing the terminal pads on a substrate becomes increasingly more difficult. Additionally, as the density of the terminal pads on a substrate increases so that the terminal pads are closer to each other and smaller in size, precise alignment of the probes with the terminal pads becomes even more difficult.

Probe tools and substrate inspection apparatus have been designed to attempt to overcome the difficulties associated with changes in substrate size and terminal pad position. For example, U.S. Pat. No. 5,491,427 discloses a probe and electrical part/circuit inspecting apparatus and method. The probe is a grid pattern of contact bump electrodes and flexibly accommodates certain changes in the position and size of the device under test. The probe allows for the testing of a wide range of semiconductor devices having various sizes and terminal arrangements assuming a regular pattern and pitch of the device terminals. The apparatus does not allow independent movement of the probe electrodes and does not provide for non-uniform distortion of the position of the terminal pads.

U.S. Pat. No. 3,963,985 discloses a probe device having multiple probe heads and a method to adjust the distance between probe heads to accommodate changes in the substrate size after processing. The probe heads are mounted on a structure having a known thermal coefficient of expansion. The structure is expanded or contracted to reposition the probe heads corresponding to changes in the dimensions of the substrate after processing. It is necessary to measure the substrate dimensions after processing and the device accommodates only uniform error and does not search for terminal pads.

Bearing in mind the problems and deficiencies of the prior art, it is therefore an object of the present invention to provide a method and apparatus which enables a probe tester to determine if a probe is making contact with a designated contact point and search for and locate the contact point if the probe is not making contact.

It is another object of the present invention to provide a method and apparatus which enables independent movement of probes relative to contact points on a substrate during a software search routine.

It is another object of the present invention to provide a method and apparatus for precisely aligning a probe with a contact point on a substrate.

It is yet another object of the present invention to provide a method and apparatus to efficiently test continuity of circuit lines and continuity between contact points on a substrate.

A further object of the invention is to provide a method and apparatus for efficiently testing semiconductor products which have significant non uniform terminal pad positional error.

A further object of the invention is to provide a method and apparatus to facilitate the testing of semiconductor substrates having small terminal pad size and positional error by eliminating extra processing steps such as mapping the location of terminal pads after processing.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for locating the position of separated electrically conductive contact points on a substrate comprising providing a first and second probe adapted to make an electrical connection to at least one contact point on the substrate to be tested. The first probe is positioned to contact a first contact point on the substrate and then measure the capacitance at the first contact point with respect to a reference plane of the substrate. In the preferred embodiment, the system compares the measured capacitance value with a predetermined threshold capacitance value in order to determine if the first probe is making electrical contact with the first contact point on the substrate.

If it is determined that the first probe is not making electrical contact with the first contact point on the substrate, the first probe may be repositioned to a first point of a first search pattern. The search pattern can be any pattern having at least two points. Preferably, the pattern is any arrangement of a plurality of points near the ideal design location of the first contact point. The capacitance is measured at the first point of the first search pattern with respect to the reference plane and the measured value is compared to the predetermined threshold value in order to determine if the first probe is making electrical contact with the first contact point. If it is determined that the first probe is still not making electrical contact with the first contact point on the substrate, the process is repeated for subsequent points of the first search pattern until the first probe makes contact with the first contact point or all points of the first search pattern have been tested.

Once it is determined that the first probe is in electrical contact with the first contact point, the second probe is positioned to contact a second contact point on the substrate and an electrical resistance measurement test is taken between the first and second probes. The measured resistance is compared to a predetermined threshold resistance value in order to determine if electrical continuity exists between the first and second contact points on the substrate.

If an electrical fault or open condition exists between the first and second probes, the second probe is repositioned to a first point of a second search pattern and the resistance between the probes is again measured. The second search pattern is any pattern having at least two points, but preferably the pattern is any arrangement of a plurality of points near the ideal design location of the second contact point. This process is repeated for subsequent points of the second search pattern until it is determined that electrical continuity exists between the first and second contact points or all points of said second search pattern have been tested.

If an open condition continues to exist after all points of the second search pattern have been tested, the first probe is repositioned to the first point of the second search pattern and a capacitance measurement is taken. The measured value is compared with the predetermined threshold value in order to determine if the first probe is making electrical contact with the second contact point. This process is repeated for each subsequent point of the second search pattern until it is determined that the first probe is making electrical contact with the second contact point or all points of the second search pattern have been tested.

The arrangement of the points of the first and second search pattern can be any shape with at least two points, for example, diamond, square, circle, oval, rectangle, or pyramid.

In a second aspect, the present invention comprises an electronic probe testing apparatus having a first probe which is adapted to make an electrical connection to at least one first electrically conductive contact point on a substrate, a second probe which is adapted to make an electrical connection to a second electrically conductive contact point on the substrate, a controller capable of independently moving the first and second probes in X and Y directions, and a tester capable of collecting capacitance and resistance measurements from the first and second probes.

In the preferred embodiment, the first and second probes are adapted to be positioned to first and second points on the substrate and the tester is adapted to measure the capacitance at the first point with respect to a reference plane of the substrate. The tester may also be adapted to compare the measured value to a predetermined threshold capacitance value in order to determine if the first probe is making electrical contact with the contact point. It is preferred that the tester be adapted to perform an electrical test between the first and second probes if it is determined that the first probe is making electrical contact with the contact point.

In the preferred embodiment, the first probe is adapted to be repositioned by the controller to a third point if it is determined that the first probe is not making electrical contact with the contact point. The second probe may be adapted to be repositioned by the controller to a fourth point if it is determined that an electrical open condition exists between the first and second probes.

In another aspect of the preferred embodiment, the controller is adapted to facilitate accurate positioning of the first and second probes in three dimensions so as to bring the tips of the first and second probes in contact with the first and second points, respectively, of the substrate under test.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 5 is a top plan view of probe movement on the substrate during a typical search routine.

DESCRIPTION OF THE PREFERRED EMBODIMENTS

Figure 1:
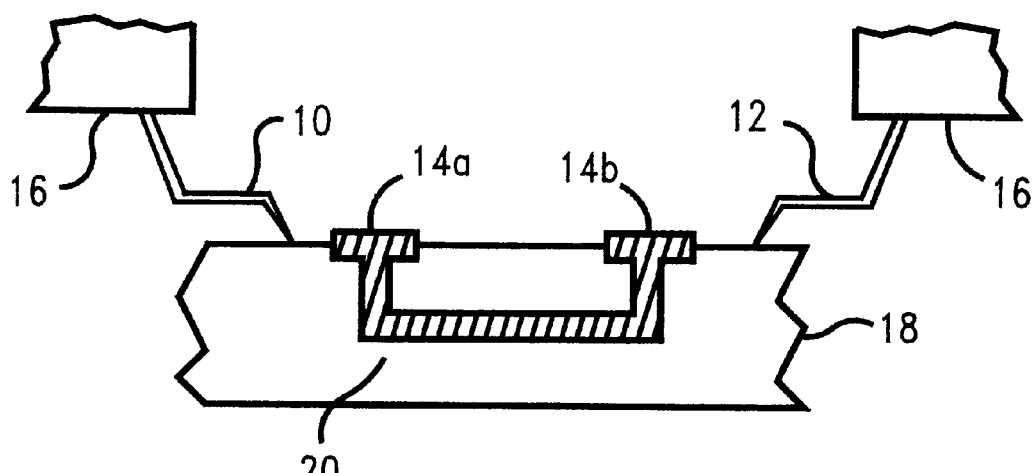
FIG. 1 is an elevational cross-sectional view of a substrate, circuit line and probes of the present invention.

In describing the preferred embodiment of the present invention, reference will be made herein to FIGS. 1–5 of the drawings in which like numerals refer to like features of the invention. Features of the invention are not necessarily shown to scale in the drawings.

Metal features within an integrated circuit semiconductor substrate have a capacitance value with respect to an internal or external reference plane. The reference plane can be the ground plane metallurgy internal to the substrate or an external metal fixture on which the substrate rests during testing. The capacitance is described by the following formula:

$$C = \epsilon A/d$$

where $\epsilon$ is the electrical permittivity of the material, A is the area of the metal feature, and d is the distance separating the feature from the reference plane.

By taking a capacitance measurement when the probe contacts the surface of the substrate under test, it is possible to discriminate between metal and non-metal features of the substrate. If the probe is in contact with the insulating material of the substrate, the measured capacitance will be equal to, or near zero. Whereas, if the measured capacitance is greater than zero by a predetermined threshold amount, there is a significant probability that the probe is contacting the metal surface of a contact point on the substrate. The value of the threshold capacitance will vary depending on the material set used in the substrate fabrication process. In general, the threshold capacitance should be set to a number slightly greater than the capacitance obtained when contacting the non-metal, or insulating features of the semiconductor substrate.

During the testing of a substrate, a pair of test probes 10, 12 are moved to the ideal contact point locations 14a and 14b on substrate 18, as shown in FIG. 1. The probes are lowered to make physical contact with the metal surface of the contact points. Using the probes, a two point resistive measurement can be taken to, verify or rule out, continuity between two points on a substrate. For example, a resistance measurement can be taken between contact points 14a and 14b to verify or rule out continuity along circuit line 20. If the measured resistance indicates a discontinuity or fault, a software controlled search routine can be immediately enabled to initiate a process to place the probes in contact with the contact points and retest the segment. As shown if FIG. 5, during the retest, each probe 10, 12, is individually moved along search pattern 26 in an attempt to make contact with the corresponding contact point 14a, 14b. A typical search pattern 26 might move the probes in a diamond shape pattern around the ideal design location of contact points 14a, 14b.

Figure 2:
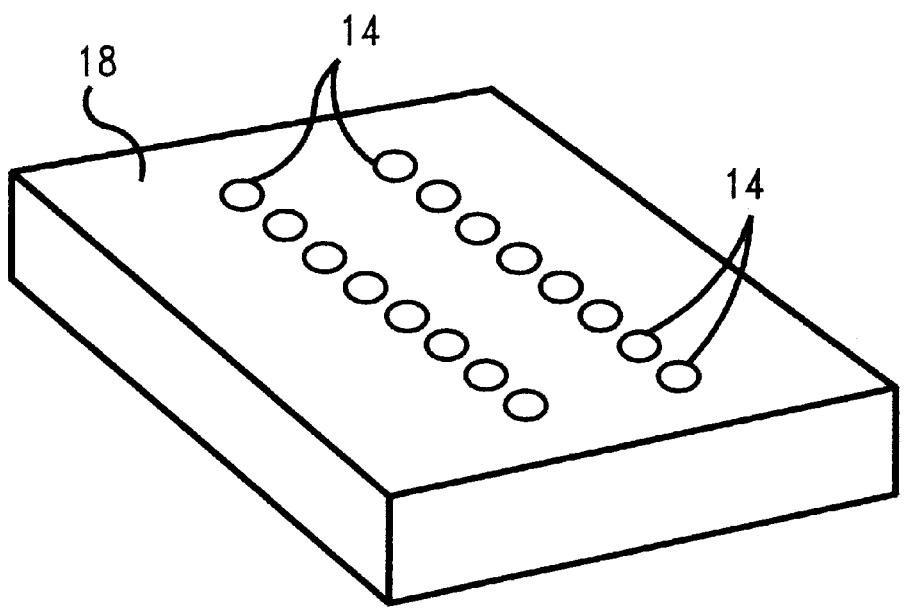
FIG. 2 is a top perspective view of a typical substrate having a plurality of contact points.
Figure 3:
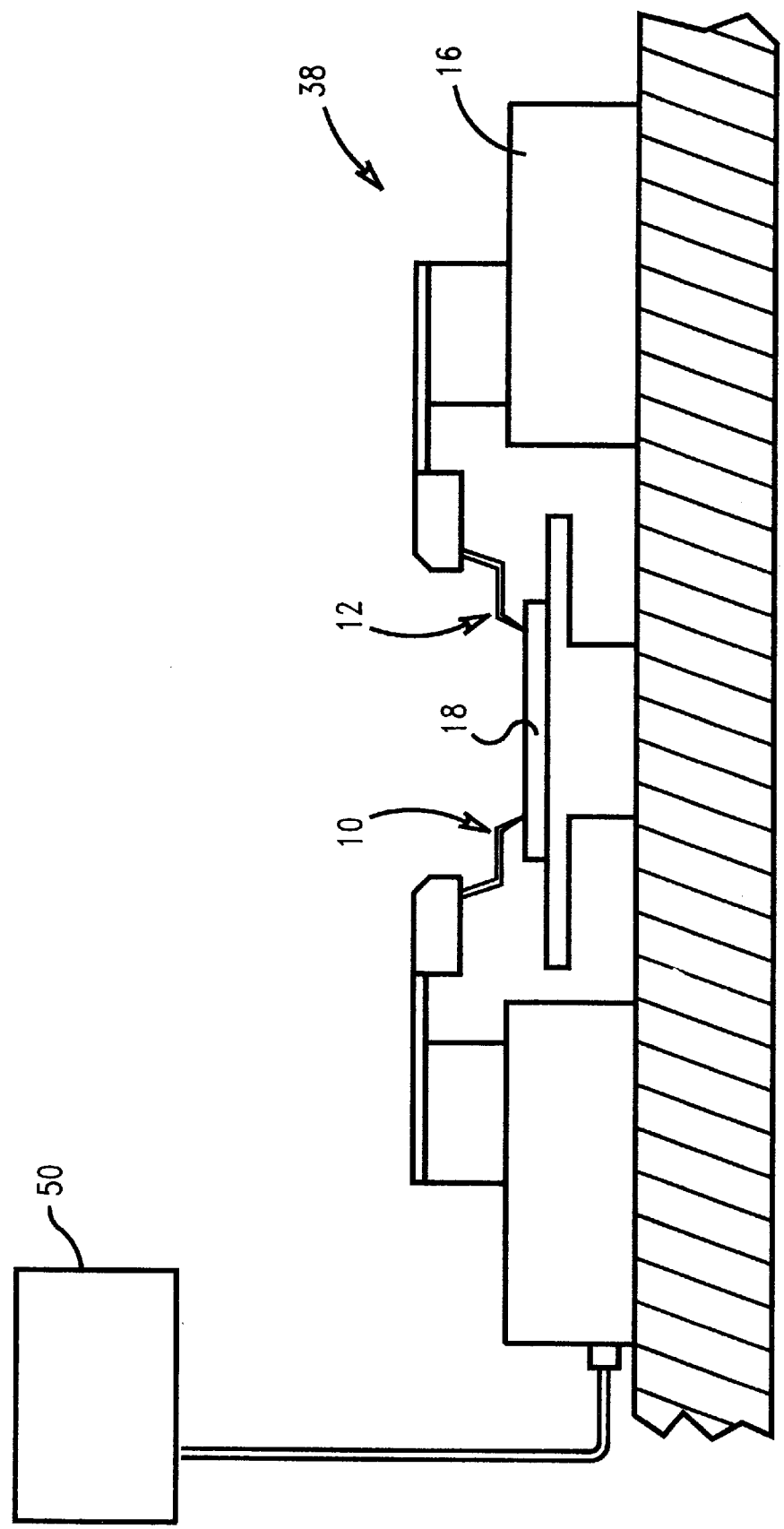
FIG. 3 is an elevational cross-sectional view of the probe apparatus of the present invention.
Figure 4:
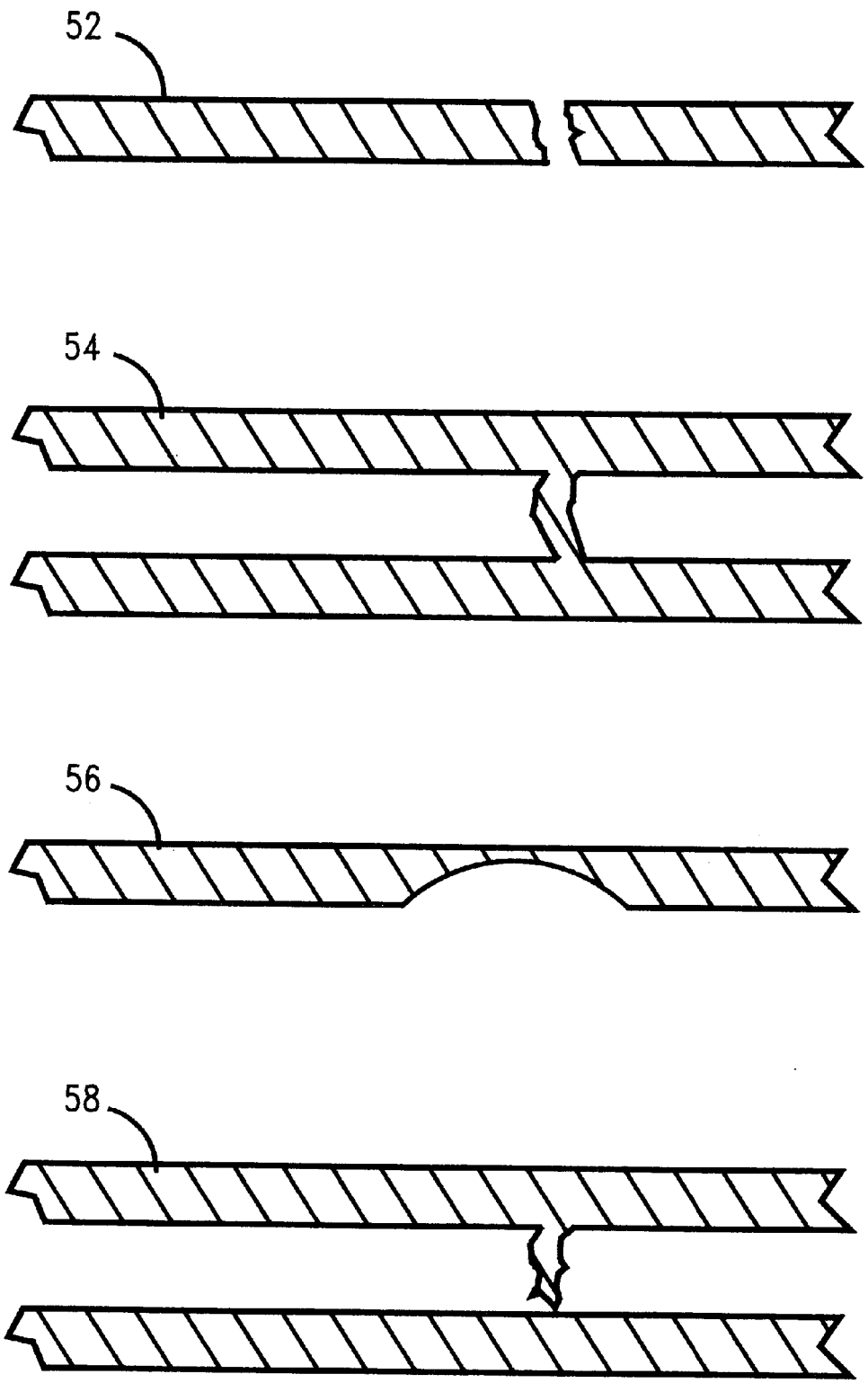
FIG. 4 is a schematic diagram of typical circuit line defects found on a substrate.

The present invention is directed to a method and apparatus to locate a plurality of contact points 14 on an integrated circuit semiconductor substrate 18 as shown in FIG. 2. Preferably, as shown in FIG. 3, a 2-point probe tester 38, sometimes called a "flying probe tester", is used to locate contact points 14 on substrate 18. The flying probe tester 38 comprises a probe positioning system 16 capable of moving first probe 10 and second probe 12 in independent XY directions, and measurement apparatus 50 to collect capacitance and resistance measurements. The flying probe tester 38 is configured to conduct line continuity measurements of circuit lines 20 embedded in substrate 18 having multiple nodes or contact points 14. A typical circuit line 20 embedded in substrate 18 with electrically conductive contact points 14a and 14b is shown in FIG. 1. When each probe, 10 and 12, makes contact with its designated contact point 14a and 14b, respectively, a line continuity or other electrical measurement can be performed. The results of the line continuity measurement can be used to determine if any one of the typical line circuit defects shown in FIG. 4, line open 52, line short 54, near open 56, or near short 58, exists on circuit line 20.

In testing for line open conditions and referring to FIG. 5, in the preferred embodiment the positioning system 16 moves first probe 10 to position 60 and second probe 12 to position 70, which correspond to the ideal design positions of first and second contact points 14a and 14b, respectively, as specified by the substrate design data. A resistance measurement can then be taken to verify or rule out an electrical connection between contact points 14a and 14b.

If the resistance measurement between the first and second probes indicates a fault, such as an open, a capacitance measurement is taken at position 60 of first probe 10. The measured value is then compared to a predetermined threshold value. If the measured value is greater than the predetermined threshold value, it is assumed that first probe 10 is contacting contact point 14a and the position is fixed for the remainder of the retest. If the measured value is less than the predetermined threshold value, first probe 10 is repositioned to first search point 61 of search pattern 26, shown in FIG. 5, and a capacitance measurement is taken. A typical search pattern 26 would move the probe in a diamond shape pattern around the ideal design location of the contact point 14a. This process is repeated until either first probe 10 contacts contact point 14a, or all points, 61–64, of search pattern 26 have been tested.

If first probe 10 is making electrical contact with first contact point 14a, a resistance measurement is taken between first probe 10 and second probe 12. If the second resistance test indicates a fault, second probe 12 is repositioned from point 70 to search point 71, and a resistance measurement between probes 10 and 12 is taken. If the resistance test indicates a fault, second probe 12 is repositioned to point 72 of search pattern 26 and another resistance measurement is taken. This process is repeated for all points, 71–74, of search pattern 26, until line continuity is verified or ruled out, or all points of search pattern 26 have been tested. Search pattern 26 can be any pattern which moves the probes about the ideal design position of contact point 14, and may have as many search points as desired.

If after completing all steps of a line continuity test the resistance measurement still indicates an open fault, or the absence of continuity, a separate test, such as capacitance, is preferably conducted to verify the existence of contact point 14b on substrate 18. First probe 10 is repositioned to position 70 and a capacitance measurement is taken to verify the existence of contact point 14b on substrate 18. The test is repeated for all points 71–74 of search pattern 26 until the existence of contact point 14b is verified or ruled out. If the resistance measurement indicates a line short or continuity, it is assumed that a valid line and contact point condition is present.

A similar procedure can be used to conduct a "shorts test", which tests for the absence of continuity between different points 14 on substrate 18.

The present invention enables the probe tester to determine if a probe is making contact with a contact point on a substrate, and if not, facilitate independent movement of the probes in order to search for and locate the contact point. It is thus possible to precisely and efficiently align the test probe with the contact point even on semiconductor substrates having small terminal pad sizes or non-uniform terminal pad positional error without having to go through the additional steps of mapping the location of the contact points after processing.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for locating the position of separated contact points on a substrate and determining if line continuity exists between said contact points comprising:

(a) providing a first probe adapted to make an electrical connection to at least a first contact point on said substrate to be tested;

(b) providing a second probe adapted to make an electrical connection to at least a second contact point on said substrate to be tested;

(c) positioning the first probe at an ideal location of said first contact point to contact said first contact point on said substrate;

(d) measuring the capacitance at the ideal location of the first contact point with respect to a reference plane of the substrate;

(e) comparing the measured value of step (d) with a predetermined threshold capacitance value in order to determine if said first probe is making electrical contact with said first contact point on the substrate; and repositioning said first probe with respect to said substrate if said comparison of said measured value of capacitance indicates that said first probe is not in contact with said first contact point on said substrate; and independently moving said first probe with respect to a search point of a search pattern located around the ideal location of said first contact point of said substrate if said comparison of said measured value of capacitance indicates that said first probe is not in contact with said first contact point on said substrate until it is determined said first probe is making electrical contact with said first contact point on the substrate or all points of said search pattern have been tested;

(f) positioning the second probe at an ideal location of said second contact point to contact said second contact point on said substrate;

(g) performing an electrical resistance measurement test between said first and second probes;

(h) comparing the measured value of step (g) with a predetermined threshold resistance value in order to determine if electrical continuity exists between said first and second contact points on said substrate.

2. The method of claim 1, further comprising in step (e) the steps of:

(i) repositioning said first probe independently of said second probe to a first contact point of a first search pattern having a plurality of points on the substrate if it is determined that said first probe is not making contact with said first contact point on the substrate;

(ii) measuring the capacitance at said first contact point on said first search pattern with respect to the reference plane; and (iii) comparing the measured value of said capacitance at said first contact point with the predetermined threshold value in order to determine if said first probe is making electrical contact with said first contact point.

3. The method of claim 2, further comprising repeating steps (e)(i) through (e)(iii) for subsequent points of said first search pattern, until it is determined that said first probe is in electrical contact with said first contact point on the substrate or all points of said first search pattern have been tested.

4. The method of claim 1, further comprising the steps between steps (f) and (g) of:

(i) repositioning said second probe independently of said first probe to a first point of a second search pattern having a plurality of points located around an ideal location of said second contact point if it is determined that an electrical fault exists between said first and second contact points.

5. The method of claim 4, further comprising repeating steps (e)(i) through (h) for subsequent points of said second search pattern until it is determined that electrical continuity exists between said first and second contact points or all points of said second search pattern have been tested.

6. The method of claim 5, further comprising:

(i) repositioning said first probe to said first point of said second search pattern if it is determined that there is an absence of electrical continuity between said first and second probes;

(j) measuring the capacitance at said first point of said second search pattern with said first probe;

(k) comparing the measured value with the predetermined threshold value in order to determine if said first probe is making electrical contact with said second contact point.

7. The method of claim 6, further comprising repeating steps (i) though (k) for each subsequent point of said second search pattern if it is determined that said first probe is not making electrical contact with said second contact point.

8. The method of claim 2, wherein the arrangement of the points of said first search pattern is a shape selected from the group consisting of diamonds, squares, circles, ovals, rectangles, and pyramids.

9. The method of claim 8, wherein said first search pattern has at least two points.

10. The method of claim 2, wherein said first search pattern is an arrangement of a plurality of points about an ideal design location of said first contact point.

11. The method of claim 4, wherein said second search pattern is an arrangement of a plurality of points about an ideal design location of said second contact point.

12. The method of claim 4, wherein the arrangement of points of said second search pattern is a shape selected from the group consisting of diamonds, squares, circles, ovals, rectangles, and pyramids.

13. The method of claim 12, wherein said second search pattern has at least two points.

14. An electronic probe testing apparatus comprising:

a first probe which is adapted to make an electrical connection to at least one first electrically conductive contact point on a substrate;

a second probe which is adapted to make an electrical connection to a second electrically conductive contact point on the substrate;

a controller capable of independently moving the first and second probes in X and Y directions in order to search for and locate said first and second contact points; and a tester capable of collecting capacitance and resistance measurements from the first and second probes;

wherein the first and second probes are adapted to be positioned to first and second points on the substrate, said tester being adapted to measure the capacitance at the first point with respect to a reference plane of the substrate; said tester being further adapted to compare the measured value to a predetermined threshold capacitance value in order to determine if said first probe is making electrical contact with said contact point; said tester being also adapted to perform an electrical test between said first and second probes if it is determined that said first probe is making electrical contact with said contact points.

15. The apparatus of claim 14, wherein said first probe is adapted to be repositioned independently of said second probe by said controller to a third point if it is determined that said first probe is not making electrical contact with said contact point.

16. The apparatus of claim 14, wherein said second probe is adapted to be repositioned independently of said first probe by said controller to a fourth point if it is determined that an electrical open condition exists between said first and second probes.

17. The apparatus of claim 14 wherein the controller is adapted to facilitate accurate positioning of the first and second probes in three dimensions so as to bring the tips of the first and second probes in contact with the first and second points, respectively, of the substrate under test.

18. The apparatus of claim 17 wherein the controller is adapted to facilitate accurate positioning of the first and second probes in three dimensions so as to bring the tips of the first and second probes in contact with the first and second points, respectively, of the substrate under test.

19. The apparatus of claim 17 wherein said first probe is capable of measuring the capacitance of said contact point.

20. An electronic probe testing apparatus comprising:
- a first probe which is adapted to make an electrical connection to at least one first electrically conductive contact point on a substrate;
- a second probe which is adapted to make an electrical connection to a second electrically conductive contact point on the substrate;
- a controller capable of independently moving the first and second probes in X, Y and Z direction in order to search for and locate said first and second contact points; and
- a tester capable of collecting electrical measurements from the first and second probes;
- wherein the first and second probes are adapted to be independently positioned to first and second points on the substrate, said tester being adapted to measure the capacitance at the first point with respect to a reference plane of the substrate; said tester being further adapted to compare the measured value to a predetermined threshold capacitance value in order to determine if said first probe is making electrical contact with said contact point; said tester being also adapted to perform an electrical test between said first and second probes if it is determined that said first probe is making electrical contact with said contact points;
- said first probe adapted to be repositioned independently of said second probe by said controller to a third point if it is determined that said first probe is not making electrical contact with said contact point; and
- said second probe adapted to be repositioned independently of said first probe by said controller to a fourth point if it is determined that an electrical open condition exists between said first and second probes.

21. A method for locating the position of separated contact points on a substrate and determining electrical conductance between said contact points comprising:
(a) providing a first probe adapted to make an electrical connection to at least a first contact point on said substrate to be tested;
(b) providing a second probe adapted to make an electrical connection to at least a second contact point on said substrate to be tested;
(c) positioning the first probe to contact an ideal position of said at least first contact point;
(d) positioning the second probe to contact an ideal position of said at least second contact point;
(e) performing a first electrical resistance measurement test between the ideally positioned first and second probes;
(f) comparing the measured value of step (e) with a predetermined threshold resistance value in order to determine if electrical continuity exists between said first and second contact points on said substrate;
(g) determining if the first probe is making electrical contact with said first contact point if it is determined in step (f) that an electrical fault exists between said first and second contact points by independently moving the first probe along a first search pattern having a plurality of points around the ideal location of the first contact point and measuring the capacitance along said first search pattern;
(h) performing a second electrical resistance measurement test between said first and second probes once it is determined that the first probe is making electrical contact with said first contact point;
(i) comparing the measured value of step (h) with a predetermined threshold resistance value in order to determine if electrical continuity exists between said first and second contact points on said substrate; and
(j) repositioning said second probe independently of said first probe along a second search pattern having a plurality of points around the ideal location of the second contact point if it is determined in step (i) that an electrical fault exists between said first and second contact points and performing a plurality of electrical resistance measurement tests between said first and second probes at subsequent points of said second search pattern until it is determined that electrical continuity exists between said first and second contact points or all points of said second search pattern have been tested.

22. The method of claim 21 wherein step (g) comprises:
(i) measuring the capacitance at the ideal position of the first contact point with respect to a reference plane of the substrate if it is determined in step (f) that electrical continuity does not exist between said first and second contact points, and
(ii) comparing the measured value with a predetermined threshold capacitance value to determine if said first probe is making electrical contact with said first contact point at the ideal position;
(iii) repositioning said first probe independently of said second probe to a first contact point of a first search pattern having a plurality of points on the substrate if it is determined that said first probe at the ideal position is not making contact with the first contact point on the substrate;
(iv) measuring the capacitance at the first contact point on the first search pattern with respect to the reference plane;
(v) comparing the measured value of said capacitance at said first contact point with the predetermined threshold value in order to determine if said first probe is making electrical contact with said first contact point on said first search pattern; and
(vi) repeating steps (i) through (v) until it is determined that said first probe is in electrical contact with said first contact point on the substrate or all points of said first search pattern have been tested.

23. The method of claim 21, further comprising:
(k) repositioning said first probe to a first point of said second search pattern if it is determined that there is an absence of electrical continuity between said first and second probes;

(l) measuring the capacitance at said first point of said second search pattern with said first probe;

(m) comparing the measured value with the predetermined threshold value in order to determine if said first probe is making electrical contact with said second contact point.

24. The method of claim 23, further comprising repeating steps (k) though (m) for each subsequent point of said second search pattern if it is determined that said first probe is not making electrical contact with said second contact point.

25. The method of claim 21, wherein the arrangement of the points of said first search pattern is a shape selected from the group consisting of diamonds, squares, circles, ovals, rectangles, and pyramids.

26. The method of claim 21, wherein said first search pattern has at least two points.

27. The method of claim 21, wherein said first search pattern is an arrangement of a plurality of points about an ideal design location of said first contact point.

28. The method of claim 21, wherein the arrangement of the points of said second search pattern is a shape selected from the group consisting of diamonds, squares, circles, ovals, rectangles, and pyramids.

29. The method of claim 21, wherein said second search pattern has at least two points.

30. The method of claim 21, wherein said second search pattern is an arrangement of a plurality of points about an ideal design location of said first contact point.

* * * * *

UNITED STATES PATENT AND TRADEMARK OFFICE
CERTIFICATE OF CORRECTION

PATENT NO.     : 6,255,827 B1
DATED          : July 3, 2001
INVENTOR(S)    : Mukta S. Farooq et al.

It is certified that error appears in the above-identified patent and that said Letters Patent is hereby corrected as shown below:

Column 7, claim 1,
Starting at line 13, replace step (e) in its entirety with the following:

-- (e) comparing the measured value of step (d) with a predetermined threshold capacitance value in order to determine if said first probe is making electrical contact with said first contact point on the substrate; and independently moving said first probe with respect to a search point of a search pattern located around the ideal location of said first contact point of said substrate if said comparison of said measured value of capacitance indicates that said first probe is not in contact with said first contact point on said substrate until it is determined said first probe is making electrical contact with said first contact point on the substrate or all points of said search pattern have been tested; --

Column 8, claim 5,
Line 2, replace "(e)" with -- (f) --.

Column 9, claim 18,
Line 11, replace "17" with -- 20 --.

Column 9, claim 19,
Line 16, replace "17" with -- 20 --.

Signed and Sealed this

Fifth Day of March, 2002

*Attest:*

JAMES E. ROGAN
*Director of the United States Patent and Trademark Office*

*Attesting Officer*